(12) United States Patent
Matsuura

(10) Patent No.: US 7,442,656 B2
(45) Date of Patent: Oct. 28, 2008

(54) METHOD AND APPARATUS FOR FORMING SILICON OXIDE FILM

(75) Inventor: Hiroyuki Matsuura, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 204 days.

(21) Appl. No.: 11/448,005

(22) Filed: Jun. 7, 2006

(65) Prior Publication Data
US 2006/0281337 A1 Dec. 14, 2006

(30) Foreign Application Priority Data
Jun. 14, 2005 (JP) ............................... 2005-173656

(51) Int. Cl.
*H01L 21/31* (2006.01)
(52) U.S. Cl. ............. 438/788; 427/248.1; 257/E21.279
(58) Field of Classification Search .................. 438/788; 427/248.1
See application file for complete search history.

(56) References Cited

U.S. PATENT DOCUMENTS

| | | | |
|---|---|---|---|
| 6,638,862 B2* | 10/2003 | Sneh | 438/685 |
| 6,833,322 B2* | 12/2004 | Anderson et al. | 438/680 |
| 6,861,334 B2* | 3/2005 | Raaijmakers et al. | 438/435 |
| 6,958,277 B2* | 10/2005 | Pomarede et al. | 438/287 |
| 2004/0077184 A1* | 4/2004 | Anderson et al. | 438/787 |
| 2005/0212139 A1* | 9/2005 | Leinikka et al. | 257/762 |
| 2005/0239297 A1* | 10/2005 | Senzaki et al. | 438/785 |
| 2005/0260347 A1* | 11/2005 | Narwankar et al. | 427/248.1 |
| 2006/0211246 A1* | 9/2006 | Ishizaka et al. | 438/685 |

FOREIGN PATENT DOCUMENTS

JP 2004-281853 10/2004

* cited by examiner

*Primary Examiner*—Alexander G Ghyka
(74) *Attorney, Agent, or Firm*—Oblon, Spivak, McClelland, Maier & Neustadt, P.C.

(57) ABSTRACT

A silicon oxide film is formed on a target substrate by CVD, in a process field configured to be selectively supplied with a first process gas containing a chlorosilane family gas, a second process gas containing a Cl-replacing gas, and a third process gas containing an oxidizing gas. This method alternately includes first to sixth steps. The first, third, and fifth steps perform supply of the first, second, and third process gases, respectively, while stopping supply of the other two process gases. Each of the second, fourth, and sixth steps stops supply of the first to third process gases. The third and fifth steps include an excitation period of supplying the second and third process gases, respectively, to the process field while exciting the respective process gases by an exciting mechanism.

16 Claims, 4 Drawing Sheets

METHOD AND APPARATUS FOR FORMING SILICON OXIDE FILM

CROSS-REFERENCE TO RELATED APPLICATIONS

This application is based upon and claims the benefit of priority from prior Japanese Patent Application No. 2005-173656, filed Jun. 14, 2005, the entire contents of which are incorporated herein by reference.

BACKGROUND OF THE INVENTION

1. Field of the Invention

The present invention relates to a film formation method and apparatus for a semiconductor process for forming a silicon oxide film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. For example, where a silicon oxide film is formed on semiconductor wafers, tetraethoxysilane (TEOS: $Si(OC_2H_5)_4$) may be used to perform a CVD (Chemical Vapor Deposition) process as a film formation process in a vertical heat processing apparatus (of the so-called batch type). According to this process, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD process which performs film formation while intermittently supplying a source gas and so forth to repeatedly form layers each having an atomic or molecular level thickness, one by one, or several by several. In general, this film formation method is called ALD (Atomic layer Deposition), which allows a predetermined process to be performed without exposing wafers to a very high temperature. Further, the ALD film formation provides good step coverage, and thus is suitable for filling recess portions of semiconductor devices, such as inter-gate gaps, which have become narrower with increased miniaturization of the devices.

For example, Jpn. Pat. Appln. KOKAI Publication No. 2004-281853 (Patent Document 1) discloses a method of forming a silicon nitride film by ALD at a low temperature of 300 to 600° C. According to this method, dichlorosilane (DCS: $SiH_2Cl_2$) gas and ammonia ($NH_3$) gas are supplied as a silane family gas and a nitriding gas, respectively, to form a silicon nitride film (SiN). Specifically, DCS gas and ammonia gas are alternately and intermittently supplied into a process container with purge periods interposed therebetween. When ammonia gas is supplied, an RF (radio frequency) is applied to generate plasma within the process container so as to promote a nitridation reaction. More specifically, when DCS gas is supplied into the process container, a layer with a thickness of one molecule or more of DCS is adsorbed onto the surface of wafers. The superfluous DCS is removed during the purge period. Then, ammonia gas is supplied and plasma is generated, thereby performing low temperature nitridation to form a silicon nitride film. These sequential steps are repeated to complete a film having a predetermined thickness.

BRIEF SUMMARY OF THE INVENTION

An object of the present invention is to provide a method and apparatus for forming a silicon oxide film, which can form the silicon oxide film at a low temperature with good step coverage.

According to a first aspect of the present invention, there is provided a film formation method for a semiconductor process for forming a silicon oxide film on a target substrate by CVD, in a process field configured to be selectively supplied with a first process gas containing a chlorosilane family gas, a second process gas containing a Cl-replacing gas, and a third process gas containing an oxidizing gas, the method alternately comprising, in an order set forth below:

a first step of performing supply of the first process gas to the process field while stopping supply of the second and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by an exciting mechanism;

a fourth step of stopping supply of the first, second, and third process gases to the process field;

a fifth step of performing supply of the third process gas to the process field while stopping supply of the first and second process gases to the process field, the fifth step comprising an excitation period of supplying the third process gas to the process field while exciting the third process gas by an exciting mechanism; and a sixth step of stopping supply of the first, second, and third process gases to the process field.

According to a second aspect of the present invention, there is provided a film formation apparatus for a semiconductor process, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas containing a chlorosilane family gas to the process field;

a second process gas supply circuit configured to supply a second process gas containing a Cl-replacing gas to the process field;

a third process gas supply circuit configured to supply a third process gas containing an oxidizing gas to the process field;

an exciting mechanism configured to selectively excite the second and third process gases to be supplied to the process field; and a control section configured to control an operation of the apparatus, wherein, in order to form a silicon oxide film on the target substrate by CVD, the control section alternately executes, in an order set forth below:

a first step of performing supply of the first process gas to the process field while stopping supply of the second and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by the exciting mechanism;

a fourth step of stopping supply of the first, second, and third process gases to the process field;

a fifth step of performing supply of the third process gas to the process field while stopping supply of the first and second process gases to the process field, the fifth step comprising an excitation period of supplying the third process gas to the process field while exciting the third process gas by the exciting mechanism; and a sixth step of stopping supply of the first, second, and third process gases to the process field.

According to a third aspect of the present invention, there is provided a computer readable medium containing program instructions for execution on a processor, which is used for a film formation apparatus for a semiconductor process for forming a silicon oxide film on a target substrate by CVD, in a process field configured to be selectively supplied with a first process gas containing a chlorosilane family gas, a second process gas containing a Cl-replacing gas, and a third process gas containing an oxidizing gas, wherein the program instructions, when executed by the processor, cause the film formation apparatus to alternately execute, in an order set forth below:

a first step of performing supply of the first process gas to the process field while stopping supply of the second and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by an exciting mechanism;

a fourth step of stopping supply of the first, second, and third process gases to the process field;

a fifth step of performing supply of the third process gas to the process field while stopping supply of the first and second process gases to the process field, the fifth step comprising an excitation period of supplying the third process gas to the process field while exciting the third process gas by an exciting mechanism; and a sixth step of stopping supply of the first, second, and third process gases to the process field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
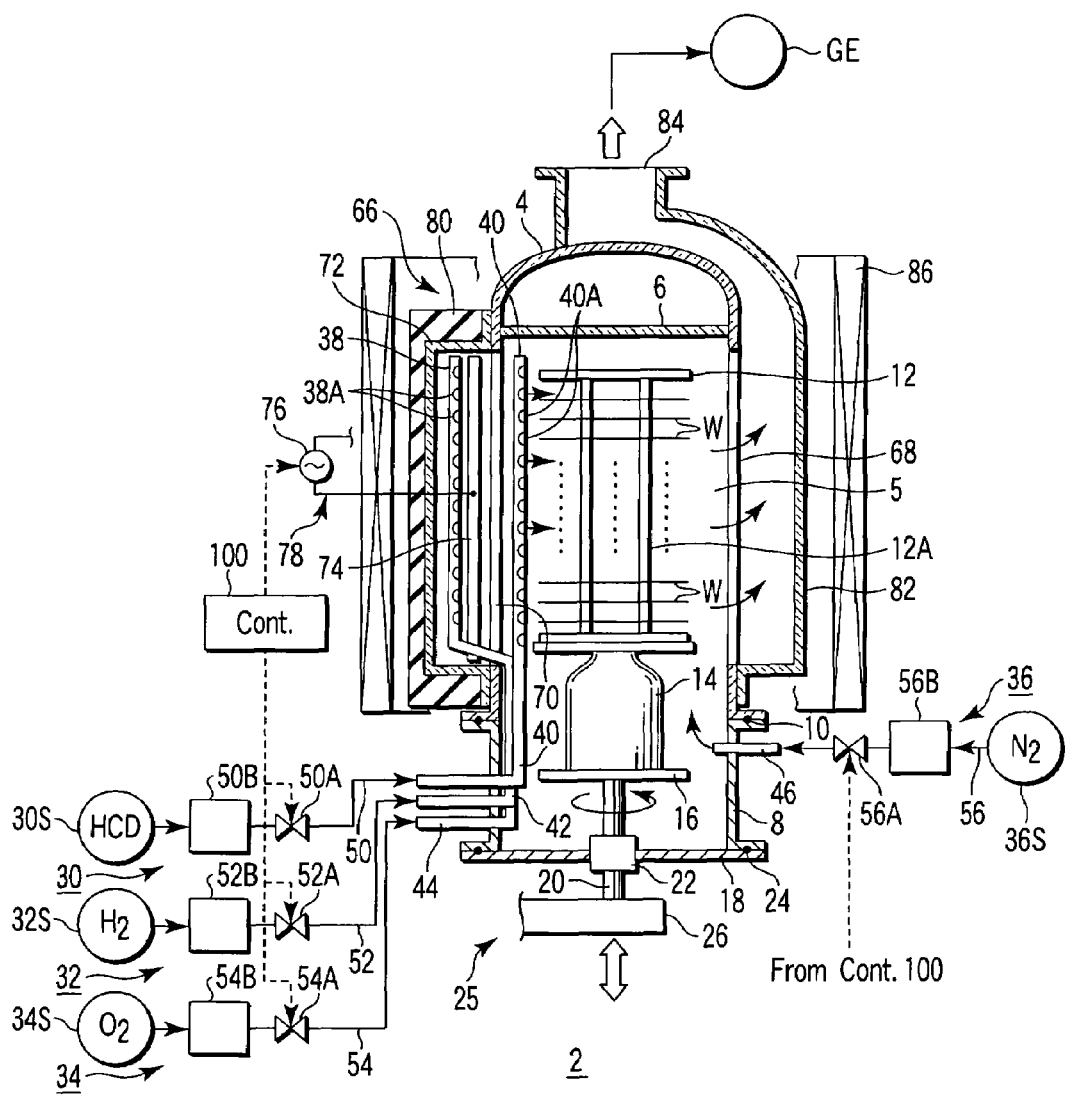
FIG. 1 is a sectional view showing a film formation apparatus (vertical CVD apparatus) according to an embodiment of the present invention.

In the process of developing the present invention, the inventor studied problems caused where a silicon oxide film is formed by ALD. As a result, the inventors have arrived at the findings given below. Specifically, if a silicon oxide film is formed in accordance with the teachings of Patent Document 1, dichlorosilane (DCS) and oxygen radicals ($O_2$*) should be used. However, in this case, where the process temperature is set to be 550° C. or less, the reaction rate of DCS to form the silicon oxide film decreases to a level lower than the practically usable level.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
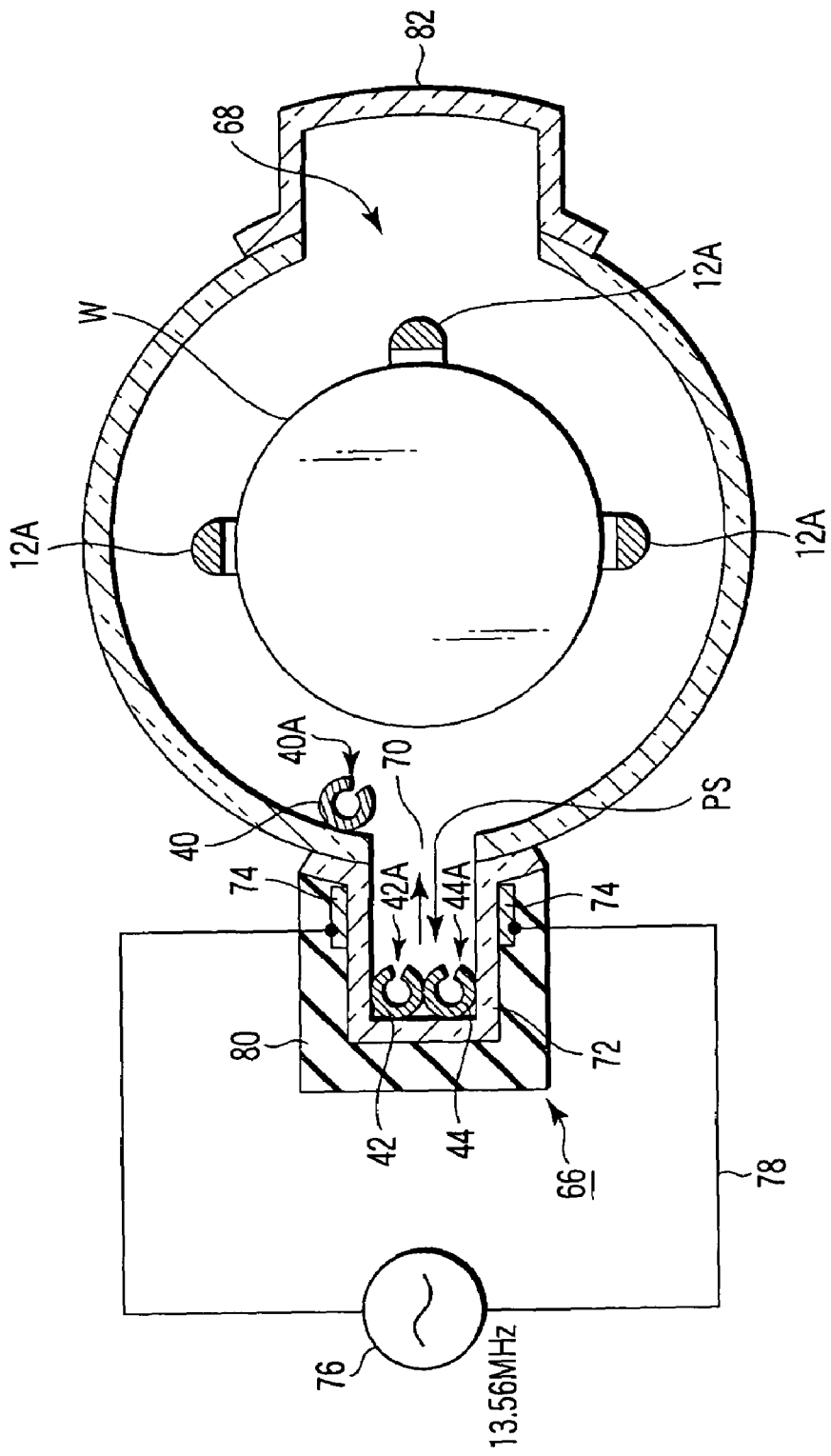
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing hexachlorodisilane (HCD: $Si_2Cl_6$) gas as a chlorosilane family gas, a second process gas containing hydrogen ($H_2$) gas as a Cl-replacing gas, and a third process gas containing oxygen ($O_2$) gas as an oxidizing gas. The film formation apparatus 2 is configured to form a silicon oxide film on target substrates by CVD in the process field.

The film formation apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a first process gas supply circuit 30, a second process gas supply circuit 32, a third process gas supply circuit 34, and a purge gas supply circuit 36. The first process gas supply circuit 30 is arranged to supply a first process gas containing a chlorosilane family gas, such as hexachlorodisilane (HCD: $Si_2Cl_6$) gas. The second process gas supply circuit 32 is arranged to supply a second process gas containing a Cl-replacing gas, such as hydrogen ($H_2$) gas. The third process gas supply circuit 34 is arranged to supply a third process gas containing an oxidizing gas, such as oxygen ($O_2$) gas. The purge gas supply circuit 36 is arranged to supply an inactive gas, such as $N_2$ gas, as a purge gas. Each of the first to third process gases is mixed with a suitable amount of carrier gas, as needed. However, such a carrier gas will not be mentioned, hereinafter, for the sake of simplicity of explanation.

More specifically, the first, second, and third process gas supply circuits 30, 32, and 34 include gas distribution nozzles 40, 42 and 44, respectively, each of which is formed of a quartz pipe which penetrates the sidewall of the manifold 8 from the outside and then turns and extends upward (see FIG. 1). The gas distribution nozzles 40, 42 and 44 respectively have a plurality of gas spouting holes 40A, 42A, and 44A, each set of holes being formed at predetermined intervals in the longitudinal direction (the vertical direction) over all the wafers W on the wafer boat 12. Each of the gas spouting holes 40A, 42A, and 44A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 40, 42, 44, and 46 are connected to gas sources 30S, 32S, 34S, and 36S of HCD gas, $H_2$ gas, $O_2$ gas, and $N_2$ gas, respectively, through gas supply lines (gas passages) 50, 52, 54, and 56, respectively. The gas supply lines 50, 52, 54, and 56 are provided with switching valves 50A, 52A, 54A, and 56A and flow rate controllers 50B, 52B, 54B, and 56B, such as mass flow controllers, respectively. With this arrangement, HCD gas, $H_2$ gas, $O_2$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertically long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzles 42 and 44 of the second and third process gases are bent outward in the radial direction of the process container 4, at a position lower than the lowermost wafer W on the wafer boat 12. Then, the gas distribution nozzles 42 and 44 vertically extend at the deepest position (the farthest position from the center of the process container 4) in the gas exciting section 66. As shown also in FIG. 2, the gas distribution nozzles 42 and 44 are disposed side by side and separated outward from an area sandwiched between the pair of electrodes 74 (a position where the RF electric field is most intense), i.e., a plasma generation area PS where the main plasma is actually generated. Each of the second process gas containing $H_2$ gas and the third process gas containing $O_2$ gas is spouted from the gas spouting holes 42A or 44A of the gas distribution nozzle 42 or 44 toward the plasma generation area PS. Then, each of the second and third process gases is excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas is disposed. The gas distribution nozzle 40 extends vertically upward on one side of the outside of the opening 70 (in the process container 4). The first process gas containing HCD gas is spouted from the gas spouting holes 40A of the gas distribution nozzle 40 toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

Figure 3:
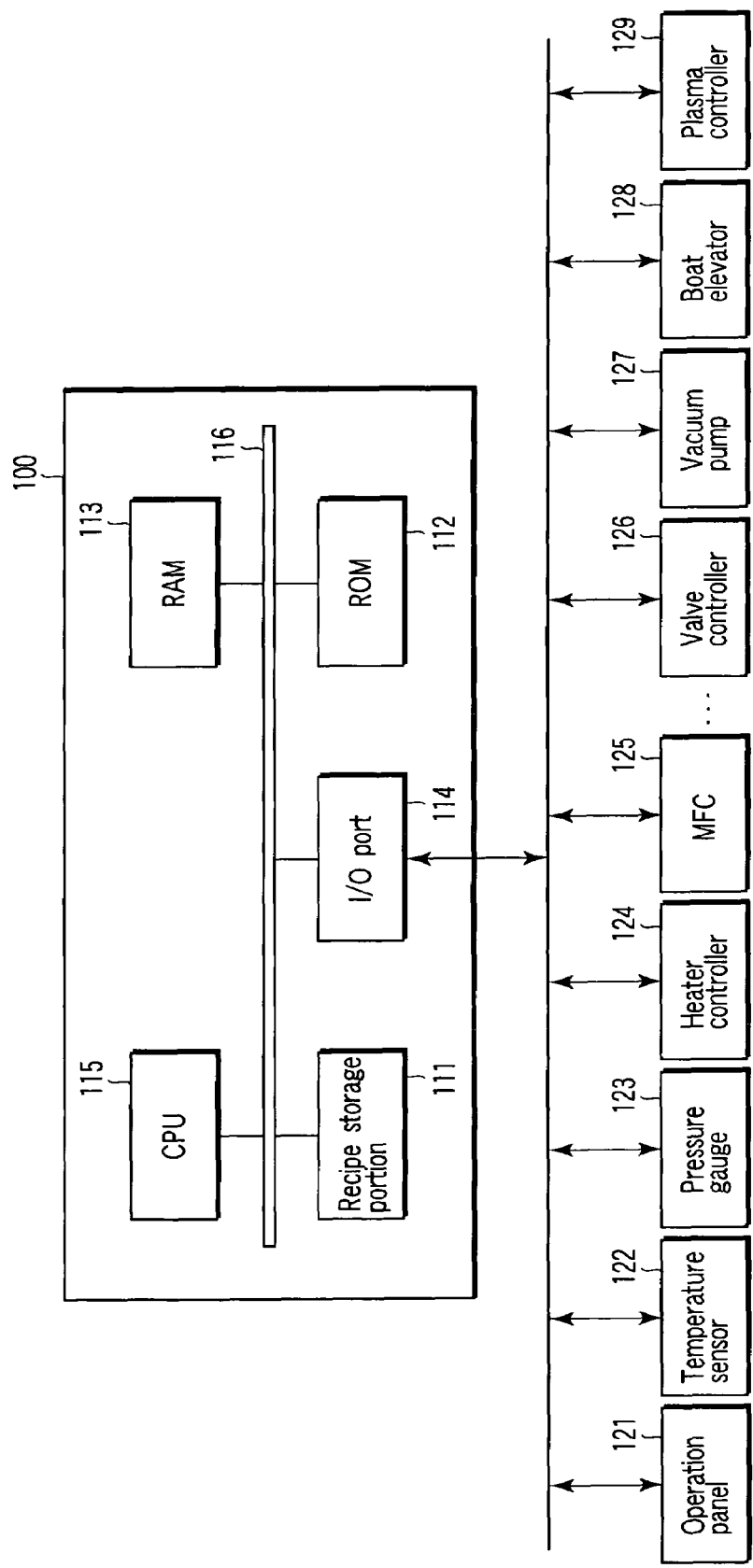
FIG. 3 is a view showing the structure of the main control section of the apparatus shown in FIG. 1.

The film formation apparatus 2 further includes a main control section 100 formed of, e.g., a computer, to control the entire apparatus. FIG. 3 is a view showing the structure of the main control section 100. As shown in FIG. 3, the main control section 100 is connected to an operation panel 121, (a group of) temperature sensors 122, (a group of) pressure gages 123, a heater controller 124, MFCs 125 (corresponding to the flow rate controllers 50B, 52B, 54B, and 56B in FIG. 1), valve controllers 126, a vacuum pump 127 (corresponding to the vacuum-exhaust system GE in FIG. 1), a boat elevator 128 (corresponding to the elevating mechanism 25 in FIG. 1), a plasma controller 129, and so forth.

The operation panel 121 includes a display screen and operation buttons, and is configured to transmit operator's instructions to the main control section 100, and show various data transmitted from the main control section 100 on the display screen. Temperature sensors 122 are configured to measure the temperature at respective portions inside the process container 4 and exhaust line, and transmit measurement values to the main control section 100. The pressure gages 123 are configured to measure the pressure at respective portions inside the process container 4 and exhaust line, and transmit measurement values to the main control section 100.

The heater controller 124 is configured to control the respective sections of the heater 86. The heater controller 124 turns on the respective sections of the heater 86 to generate heat, in accordance with instructions from the main control section 100. The heater controller 124 is also configured to measure the power consumption of the respective sections of the heater 86, and transmit it to the main control section 100.

The MFCs 125 are respectively disposed on the piping of the gas supply lines. Each MFC 125 is configured to control the flow rate of a gas flowing through the corresponding line in accordance with instructed values received from the main control section 100. Further, each MFC 125 is configured to measure the flow rate of a gas actually flowing, and transmit the reading to the main control section 100.

The valve controllers 126 are respectively disposed on the piping of the gas supply lines and configured to control the opening rate of valves disposed on the piping, in accordance with instructed values received from the main control section 100. The vacuum pump 127 is connected to the exhaust line and configured to exhaust gas inside the process container 4.

The boat elevator 128 is configured to move up the lid 18, so as to load the wafer boat 12 (semiconductor wafers W) placed on the rotary table 16 into the process container 4. The boat elevator 128 is also configured to move the lid 18 down, so as to unload the wafer boat 12 (semiconductor wafers W) placed on the rotary table 16 from the process container 4.

The plasma controller 129 is configured to control the gas exciting section 66 in accordance with instructions received from the main control section 100. Consequently, the plasma controller 129 controls generation of radicals of hydrogen gas or oxygen gas, when the gas is supplied and activated in the gas exciting section 66.

The main control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 2 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the process container 4, start/stop timing for supply of process gases, and supply rates of process gases, from the time semiconductor wafers W are loaded into the process container 4 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, boat elevator 128, and plasma controller 129 and is configured to control output/input of data or signals.

The CPU (Central Processing Unit) 115 is the hub of the main control section 100. The CPU 115 is configured to run control programs stored in the ROM 112, and control an operation of the film formation apparatus 2, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the process container 4 and exhaust line. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a film formation method (so called ALD (Atomic Layer Deposition) film formation) performed under the control of the main control section 100 in the apparatus shown in FIG. 1. In the film formation method according to this embodiment, a silicon oxide film is formed on semiconductor wafers W by CVD. In order to achieve this, a first process gas containing hexachlorodisilane (HCD) gas as a chlorosilane family gas, a second process gas containing $H_2$ gas as a Cl-replacing gas, and a third process gas containing $O_2$ gas as an oxidizing gas are selectively supplied into the process field 5 accommodating wafers W.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases are intermittently supplied from the respective gas distribution nozzles 40, 42, and 44 at controlled flow rates.

In summary, at first, the first process gas containing HCD gas is supplied from the gas spouting holes 40 of the gas distribution nozzle 40 to form gas flows parallel with the wafers W on the wafer boat 12. While being supplied, molecules of HCD gas and molecules and atoms of decomposition products generated by gas decomposition are adsorbed on the wafers W to form an adsorption layer (first stage: HCD adsorption).

Then, the second process gas containing $H_2$ gas is supplied from the gas spouting holes 42A of the gas distribution nozzle 42 to form gas flows parallel with the wafers W on the wafer boat 12. The second process gas is selectively excited and partly turned into plasma when it passes through the plasma generation area PS between the pair of electrodes 74. At this time, hydrogen radicals (activated species), such as H* and $H_2$*, are produced (the symbol [*] denotes that it is a radical). The radicals flow out from the opening 70 of the gas exciting section 66 toward the center of the process container 4, and are supplied into gaps between the wafers W in a laminar flow state.

When hydrogen radicals are supplied onto the wafers W, chlorine atoms in the adsorption layer on the wafers W and chlorine atoms adsorbed on the wafers W are replaced with hydrogen atoms of the hydrogen radicals (transformation from Si—Cl to Si—H), or they react with the hydrogen radicals. Consequently, chlorine atoms on the wafer W and in the adsorption layer are removed (second stage: Cl removal).

Then, the third process gas containing $O_2$ gas is supplied from the gas spouting holes 44A of the gas distribution nozzle 44 to form gas flows parallel with the wafers W on the wafer boat 12. The third process gas is selectively excited and partly turned into plasma when it passes through the plasma generation area PS between the pair of electrodes 74. At this time, oxygen radicals (activated species), such as O* and $O_2$*, are produced. The radicals flow out from the opening 70 of the gas exciting section 66 toward the center of the process container 4, and are supplied into gaps between the wafers W in a laminar flow state.

When oxygen radicals are supplied onto the wafers W, the adsorption layer containing reduced chlorine atoms on the wafers W reacts with Si and H, so H is removed and a thin film of silicon oxide is formed on the wafers W (third stage: oxidation). Alternatively, when HCD flows onto oxygen radicals adsorbed on the surface of the wafers W, the same reaction is caused, so a thin film of silicon oxide is formed on the wafers W.

Figure 4:
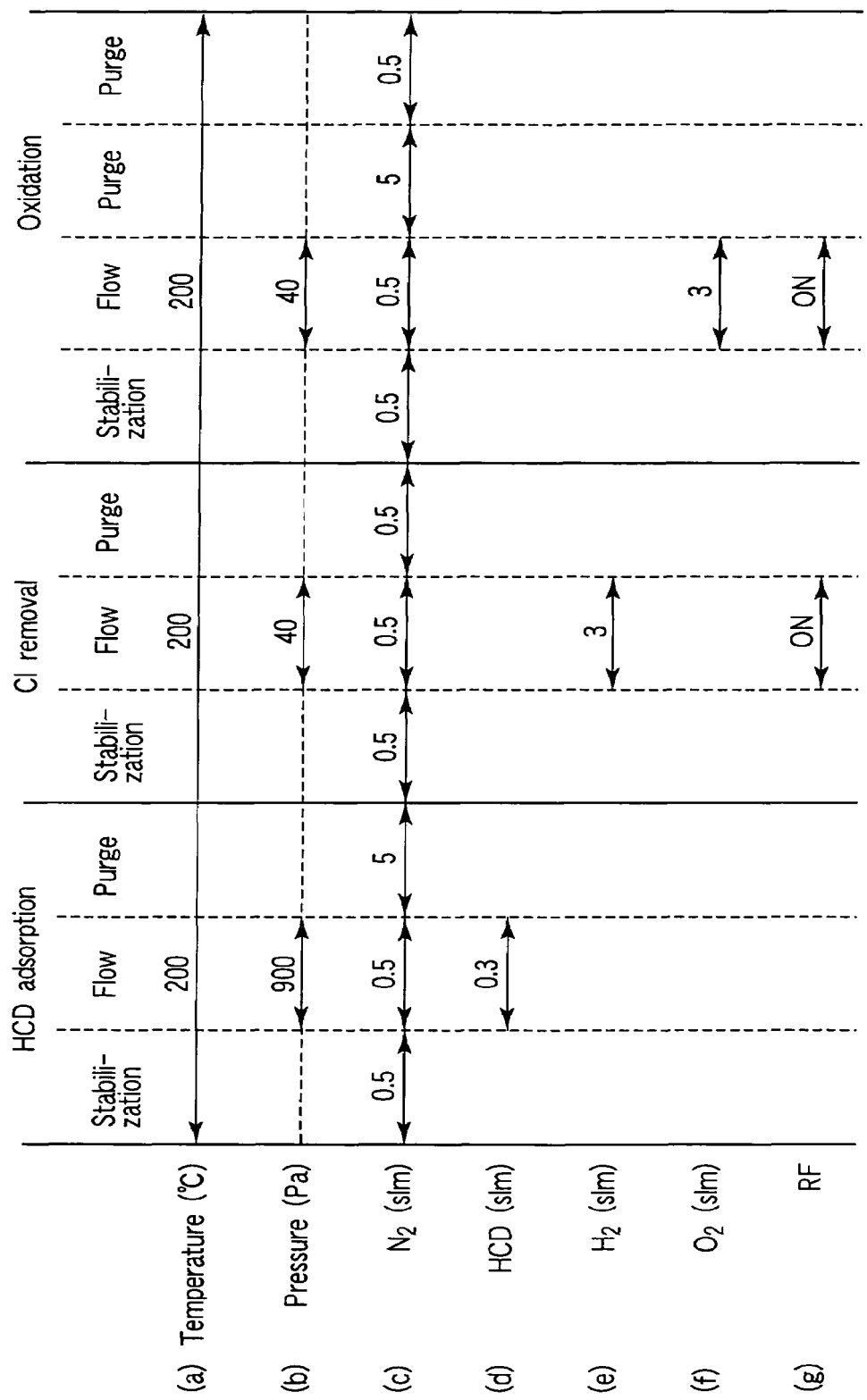
FIG. 4 is a timing chart showing the recipe of a film formation method according to the embodiment of the present invention.

FIG. 4 is a timing chart showing the recipe of a film formation method according to the embodiment of the present invention. As shown in FIG. 4, the film formation method according to this embodiment is arranged to alternately repeat first to third stages ST1 to ST3 in this order. A cycle comprising the first to third stages ST1 to ST3 is repeated a number of times, e.g., 200 times, and thin films of silicon oxide formed by respective cycles are laminated, thereby arriving at a silicon oxide film having a target thickness. The respective stages will be explained in more detail below.

[First Stage ST1: HCD Adsorption]

At first, nitrogen gas is supplied into the process field 5 at a predetermined flow rate, such as 0.5 slm (standard liter per minute), as shown in FIG. 4, (c). Further, the process field 5 is set at a predetermined temperature, such as 200° C., as shown in FIG. 4, (a). At this time, the process field 5 is exhausted to set the process field 5 at a predetermined pressure, such as 900 Pa, as shown in FIG. 4, (b). These operations are continued until the process field 5 is stabilized at the predetermined pressure and temperature (stabilization step).

When the process field 5 is stabilized at a predetermined pressure and temperature, HCD gas is supplied into the process field 5 at a predetermined flow rate, such as 0.3 slm, as shown in FIG. 4, (d), and nitrogen gas is also supplied into the process field 5 at a predetermined flow rate, such as 0.5 slm, as shown in FIG. 4, (c) (flow step). HCD gas thus supplied into process field 5 is heated and thereby activated in the process field 5, and forms an adsorption layer on the surface of the wafers W.

The temperature of the process field 5 is preferably set to be 180 to 250° C. If the temperature is lower than 180° C., no silicon oxide film may be formed. If the temperature is higher than 250° C., an adsorption layer may be irregularly formed, thereby deteriorating uniformity in the quality and thickness of a silicon oxide film to be formed. The temperature of the process field 5 is more preferably set to be 190 to 220° C. This temperature range makes it possible to further improve uniformity in the quality and thickness of a silicon oxide film to be formed.

The pressure of the process field 5 is preferably set to be 400 to 1,200 Pa. This pressure range makes it possible to promote HCD adsorption onto the wafers W. The pressure of the process field 5 is more preferably set to be 800 to 1000 Pa. This pressure range makes it possible to easily control the pressure of the process field 5.

The flow rate of HCD gas is preferably set to be 0.1 to 0.5 slm. If the flow rate is lower than 0.1 slm, HCD adsorption on the wafers W may be insufficient. If the flow rate is higher than 0.5 slm, the ratio of HCD contributory to adsorption onto the wafers W may become too low. The flow rate of HCD gas is more preferably set to be 0.3 to 0.5 slm. This flow rate range makes it possible to promote HCD adsorption onto the wafers W.

When HCD gas is supplied for a predetermined time period, the supply of HCD gas is stopped. On the other hand, the flow rate of nitrogen gas is increased, and nitrogen gas is supplied into the process field 5 at a predetermined flow rate, such as 5 slm, as shown in FIG. 4, (c). At this time, the process field 5 is exhausted to exhaust gas therein out of the process field 5 (purge step).

It should be noted that, in light of the film formation sequence, the temperature of the process field 5 is preferably set to be constant over the first to third stages. Accordingly, in this embodiment, the temperature of the process field 5 is set at 200° C. over the first to third stages. Further, the process field 5 is kept exhausted over the first to third stages.

[Second Stage ST2: Cl Removal]

Subsequently, nitrogen gas is supplied into the process field 5 at a predetermined flow rate, such as 0.5 slm, as shown in FIG. 4, (c). Further, the process field 5 is set at a predetermined temperature, such as 200° C., as shown in FIG. 4, (a). At this time, the process field 5 is exhausted to set the process field 5 at a predetermined pressure, such as 40 Pa, as shown in FIG. 4, (b). These operations are continued until the process field 5 is stabilized at the predetermined pressure and temperature (stabilization step).

When the process field 5 is stabilized at a predetermined pressure and temperature, an RF power is applied between the electrodes 11 (RF: ON), as shown in FIG. 4, (g). Further, hydrogen gas is supplied to a position between the electrodes 11 (in the gas exciting section 6) at a predetermined flow rate, such as 3 slm, as shown in FIG. 4, (e). Hydrogen gas thus supplied is excited (activated) into plasma between the electrodes 11 and generates hydrogen radicals. The hydrogen radicals thus generated are supplied from the gas exciting section 66 into the process field 5. Further, nitrogen gas is also supplied into the process field 5 at a predetermined flow rate, such as 0.5 slm, as shown in FIG. 4, (c) (flow step).

The flow rate of hydrogen gas is preferably set to be 0.5 to 5 slm. This flow rate range makes it possible to generate plasma without difficulty and to supply hydrogen radicals sufficient to replace Cl with H on the wafers W. The flow rate of hydrogen gas is more preferably set to be 1.5 to 2.3 slm. This flow rate range makes it possible to further decrease the chlorine concentration in a film to be formed.

The RF power is preferably set to be 10 to 1,500 W. If the power is lower than 10 W, it is difficult to generate hydrogen radicals. If the power is higher than 1,500 W, the quartz wall of the gas exciting section 66 may be damaged. The RF power is more preferably set to be 300 to 500 W. This power range makes it possible to efficiently generate hydrogen radicals.

The pressure of the process field 5 is preferably set to be 40 to 100 Pa. This pressure range makes it possible to easily generate hydrogen radicals and to increase the mean free path of hydrogen radicals in the process field 5. The pressure of the process field 5 is more preferably set to be 50 to 70 Pa. This pressure range makes it possible to easily control the pressure of the process field 5.

The pressure inside the gas exciting section 66 (the pressure at the gas spouting holes) is preferably set to be 70 to 400 Pa, and more preferably to be 350 to 400 Pa. This pressure range makes it possible to generate plasma without difficulty and to supply hydrogen radicals sufficient to replace Cl with H on the wafers W.

When hydrogen gas is supplied for a predetermined time period, the supply of hydrogen gas is stopped and the application of RF power is stopped. On the other hand, the flow rate of nitrogen gas is maintained, and nitrogen gas is supplied into the process field 5 at a predetermined flow rate, such as 0.5 slm, as shown in FIG. 4, (c). At this time, the process field 5 is exhausted to exhaust gas therein out of the process field 5 (purge step). This purge step is set to use a smaller flow rate of nitrogen gas, such as a flow rate less than 1/5 and preferably 1/8 of that used in each of the purge steps of the first and third stages ST1 and ST3. This arrangement makes it possible in the following oxidation process to prevent residual nitrogen gas from affecting oxidation gas and, e.g., generating radicals (activated species), such as NO* or NO$_2$*, that exert ill effects on oxidation.

[Third Stage ST3: Oxidation]

Subsequently, nitrogen gas is supplied into the process field 5 at a predetermined flow rate, such as 0.5 slm, as shown in FIG. 4, (c). Further, the process field 5 is set at a predetermined temperature, such as 200° C., as shown in FIG. 4, (a). At this time, the process field 5 is exhausted to set the process field 5 at a predetermined pressure, such as 40 Pa, as shown in FIG. 4, (b). These operations are continued until the process field 5 is stabilized at the predetermined pressure and temperature (stabilization step).

When the process field 5 is stabilized at a predetermined pressure and temperature, an RF power is applied between the electrodes 11 (RF: ON), as shown in FIG. 4, (g). Further, oxygen gas is supplied to a position between the electrodes 11 (in the gas exciting section 6) at a predetermined flow rate, such as 3 slm, as shown in FIG. 4, (f). Oxygen gas thus supplied is excited (activated) into plasma between the electrodes 11 and generates oxygen radicals. The oxygen radicals thus generated are supplied from the gas exciting section 66 into the process field 5. Further, nitrogen gas is also supplied into the process field 5 at a predetermined flow rate, such as 0.5 slm, as shown in FIG. 4, (c) (flow step).

The flow rate of oxygen gas is preferably set to be 1 to 8 slm, and more preferably to be 3 to 5 slm. This flow rate range makes it possible to generate plasma without difficulty and to supply oxygen radicals sufficient to replace Si—H groups with Si—O groups on the wafers W.

The RF power is preferably set to be 10 to 1,500 W. If the power is lower than 10 W, it is difficult to generate oxygen radicals. If the power is higher than 1,500 W, the quartz wall of the gas exciting section 66 may be damaged. The RF power is more preferably set to be 300 to 500 W. This power range makes it possible to efficiently generate oxygen radicals.

The pressure of the process field 5 is preferably set to be 40 to 100 Pa. This pressure range makes it possible to easily generate oxygen radicals and to increase the mean free path of oxygen radicals in the process field 5. The pressure of the process field 5 is more preferably set to be 50 to 70 Pa. This pressure range makes it possible to easily control the pressure of the process field 5.

The pressure inside the gas exciting section 66 (the pressure at the gas spouting holes) is preferably set to be 70 to 600 Pa, and more preferably to be 280 to 330 Pa. This pressure range makes it possible to generate plasma without difficulty and to supply oxygen radicals sufficient to replace Si—H groups with Si—O groups on the wafers W.

When oxygen gas is supplied for a predetermined time period, the supply of oxygen gas is stopped and the application of RF power is stopped. On the other hand, the flow rate of nitrogen gas is increased, and nitrogen gas is supplied into the process field 5 at a predetermined flow rate, such as 5 slm, as shown in FIG. 4, (c). At this time, the process field 5 is exhausted to exhaust gas therein out of the process field 5 (purge step). Then, the flow rate of nitrogen gas is decreased to 0.5 slm, while the process field 5 is exhausted. This additional purging with a lower flow rate of nitrogen gas may be omitted.

[Consequence and Modification]

As described above, the film formation method according to this embodiment is arranged to alternately repeat first to third stages ST1 to ST3 in this orders, e.g., 200 times. In this process, HCD is first supplied onto the wafers W to form an HCD adsorption layer, then hydrogen radicals are supplied to remove chlorine from the adsorption layer, and then oxygen radicals are supplied to oxidize the adsorption layer. As a result, a silicon oxide film can be formed with high efficiency and low residual chlorine.

When the silicon oxide film formed on the surface of the semiconductor wafers W reaches a predetermined thickness, the wafers W are unloaded. Specifically, nitrogen is supplied into the process field 5 at a predetermined flow rate, so that the pressure inside the process field 5 is returned to atmospheric pressure, and the process field 5 is set at a predetermined temperature. Then, the lid 18 is moved down by the boat elevator 25, and the wafer boat 12 is thereby unloaded out of the process container 4, along with the wafers W.

A silicon oxide film thus formed was examined in terms of step coverage, which was found to be almost 100%. Further, this film was good in film thickness uniformity. Accordingly, it has been confirmed that a silicon oxide film can be formed at a low temperature with good step coverage.

In the embodiment described above, the exciting section 66 for generating plasma of the film formation apparatus 2 is integrally combined with the process container 4. Alternatively, the exciting section 66 may be separately disposed from the process container 4, so as to excite gas outside the process container 4 (so called remote plasma), and then supply the excited gas into the process container 4. If gas is supplied without being activated, the process temperature needs to be increased to some extent to compensate for energy decrease due to no plasma being used.

In the embodiment described above, the first process gas contains HCD gas as a chlorosilane family gas. In this respect, the chlorosilane family gas may be one or more gases selected from the group consisting of dichlorosilane (DCS), hexachlorodisilane (HCD), trichlorosilane ($SiHCl_3$), and tetrachlorosilane (TCS: $SiCl_4$).

In the embodiment described above, the third process gas contains oxygen gas as an oxidizing gas. In this respect, the oxidizing gas may be one or more gases selected from the group consisting of oxygen ($O_2$), nitrogen oxide (NO), and dinitrogen oxide ($N_2O$).

In the embodiment described above, a cycle comprising the first stage ST1 (HCD adsorption), second stage ST2 (Cl removal), and third stage ST3 (oxidation) is repeated 200 times. In this respect, for example, the first 100 cycles may be arranged to perform only the first stage ST1 (HCD adsorption) and third stage ST3 (oxidation) without the second stage ST2 (Cl removal). The film quality of a silicon oxide film can be controlled by adjusting the number of Cl removal stages to be performed, as described above.

In the embodiment described above, a silicon oxide film is formed on semiconductor wafers W by performing 200 cycles. In this respect, the number of cycles may be decreased to, e.g., 50 cycles or 100 cycles, or may be increased to, e.g., 300 cycles or 400 cycles. Also in this case, a silicon oxide film can be formed to have a predetermined thickness by adjusting, e.g., the flow rates of HCD gas and oxygen gas, in accordance with the number of cycles.

In the embodiment described above, plasma is used to generate hydrogen radicals and oxygen radicals. In this respect, hydrogen and oxygen may be activated by another type of energy, such as magnetism or ultraviolet radiation.

In the embodiment described above, nitrogen gas is supplied when each of the process gases, such as HCD gas, is supplied. In this respect, no nitrogen gas may be supplied when each of the process gases is supplied. However, each of the process gases preferably contains nitrogen gas as a dilution gas, because the process time can be more easily controlled if it is so arranged. The dilution gas consists preferably of an inactive gas, such as nitrogen gas, helium gas (He), neon gas (Ne), or argon gas (Ar), as well as nitrogen gas.

In the embodiment described above, the gas supply nozzles are disposed in accordance with the types of gases. Alternatively, a plurality of gases may be supplied through a common gas supply nozzle. Further, a plurality of gas supply nozzles may be connected to the sidewall of the process container 4 near the bottom, to supply each gas through a plurality of nozzles. In this case, a process gas is supplied through a plurality of gas supply nozzles into the process container 4, and thereby more uniformly spreads in the process container 4.

In the embodiment described above, the heat processing apparatus employed is a heat processing apparatus of the batch type having a single-tube structure. However, for example, the present invention may be applied to a vertical heat processing apparatus of the batch type having a process container 4 of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

The control section 100 of the heat processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a silicon oxide film on a target substrate by CVD, in a process field configured to be selectively supplied with a first process gas containing a chlorosilane family gas, a second process gas containing a Cl-replacing gas, and a third process gas containing an oxidizing gas, the method alternately comprising, in an order set forth below:
   a first step of performing supply of the first process gas to the process field while stopping supply of the second and third process gases to the process field;
   a second step of stopping supply of the first, second, and third process gases to the process field;
   a third step of performing supply of the second process gas to the process field while stopping supply of the first and third process gases to the process field, the third step comprising an excitation period of supplying the second process gas to the process field while exciting the second process gas by an exciting mechanism;
   a fourth step of stopping supply of the first, second, and third process gases to the process field;
   a fifth step of performing supply of the third process gas to the process field while stopping supply of the first and second process gases to the process field, the fifth step comprising an excitation period of supplying the third process gas to the process field while exciting the third process gas by an exciting mechanism; and
   a sixth step of stopping supply of the first, second, and third process gases to the process field.

2. The method according to claim 1, wherein the first to sixth steps are arranged to set the process field to be 180 to 250° C.

3. The method according to claim 1, wherein the first step is arranged to set the process field at 400 to 1,200 Pa, and the third and fifth step is arranged to set the process field at 40 to 100 Pa.

4. The method according to claim 1, wherein the Cl-replacing gas comprises hydrogen gas.

5. The method according to claim 1, wherein the chlorosilane family gas comprises at least one gas selected from the group consisting of hexachlorodisilane, trichlorosilane, tetrachlorosilane, and dichlorosilane.

6. The method according to claim 1, wherein the oxidizing gas comprises at least one gas selected from the group consisting of oxygen, nitrogen oxide, and dinitrogen oxide.

7. The method according to claim 1, wherein gas inside the process field is kept exhausted from the first step to the sixth step.

8. The method according to claim 7, wherein each of the second and sixth steps comprises a period of supplying nitrogen gas as a purge gas to the process field.

9. The method according to claim 8, wherein the fourth step comprises a period of supplying nitrogen gas as a purge gas to the process field at a flow rate less than 1/5 of that in the second and sixth steps.

10. The method according to claim 1, wherein the exciting mechanism for exciting the second process gas and the exciting mechanism for exciting the third process gas comprise a common exciting mechanism.

11. The method according to claim 10, wherein the common exciting mechanism comprises a plasma generation area disposed in a space communicating with the process field and between the target substrate and each of supply ports of the second and third process gases disposed side by side, and each of the second and third process gases is excited while passing through the plasma generation area.

12. The method according to claim 11, wherein the first process gas is supplied to the process field from a position between the plasma generation area and the target substrate.

13. The method according to claim 11, wherein the third and fifth steps are arranged to set each of the supply ports of the second and third process gases at 70 to 400 Pa.

14. The method according to claim 1, wherein the process field is configured to accommodate a plurality of target substrates at intervals in a vertical direction, and the target substrates are heated by a heater disposed around the process field.

15. The method according to claim 14, wherein each of the first, second, and third process gases is supplied from a plurality of gas spouting holes to form gas flows parallel with the target substrates, and the gas spouting holes are arrayed over the target substrates in a vertical direction.

16. A computer readable medium containing program instructions for execution on a processor, which is used for a film formation apparatus for a semiconductor process for forming a silicon oxide film on a target substrate by CVD, in a process field configured to be selectively supplied with a first process gas containing a chlorosilane family gas, a second process gas containing a Cl-replacing gas, and a third process gas containing an oxidizing gas, wherein the program instructions, when executed by the processor, cause the film formation apparatus to alternately execute, in an order set forth below:

a first step of performing supply of the first process gas to the process field while stopping supply of the second and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by an exciting mechanism;

a fourth step of stopping supply of the first, second, and third process gases to the process field;

a fifth step of performing supply of the third process gas to the process field while stopping supply of the first and second process gases to the process field, the fifth step comprising an excitation period of supplying the third process gas to the process field while exciting the third process gas by an exciting mechanism; and a sixth step of stopping supply of the first, second, and third process gases to the process field.

* * * * *